United States Patent
Meltzer et al.

(10) Patent No.: US 7,352,248 B2
(45) Date of Patent: Apr. 1, 2008

(54) METHOD AND APPARATUS FOR MAINTAINING A CLOCK/DATA RECOVERY CIRCUIT FREQUENCY DURING TRANSMITTER LOW POWER MODE

(75) Inventors: David Meltzer, Wappinger Falls, NY (US); Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 128 days.

(21) Appl. No.: 11/069,379

(22) Filed: Mar. 1, 2005

(65) Prior Publication Data

US 2006/0198482 A1 Sep. 7, 2006

(51) Int. Cl.
*H03L 7/087* (2006.01)
(52) U.S. Cl. .......................... 331/11; 375/376; 713/322
(58) Field of Classification Search ................ 331/11; 375/376; 713/322
See application file for complete search history.

(56) References Cited

U.S. PATENT DOCUMENTS

| | | | |
|---|---|---|---|
| 6,566,967 B1 * | 5/2003 | Anumula et al. ............. | 331/11 |
| 6,630,860 B1 | 10/2003 | Anumula et al. | |
| 6,683,930 B1 * | 1/2004 | Dalmia ....................... | 375/376 |
| 6,727,756 B2 | 4/2004 | Mulder et al. | |
| 7,089,444 B1 * | 8/2006 | Asaduzzaman et al. ..... | 713/600 |

OTHER PUBLICATIONS

"A 2.5 Gb/s 15-mW Clock Recovery Circuit", B. Razavi *IEEE Journal of Solid-State Circuits*, vol. 31, No. 4, Apr. 1996, pp. 472-480.
"Jitter Analysis of a PLL-based CDR with a Bang-Bang Phase Detector", M Ramezani, et al., *IEEE Circuits and Systems*, The 2002 45th Midwest Symposium, 2002, pp. III-393-III-396.
"PCI Express and Advanced Switching: Evolutionary Path to Building Next Generation Interconnects", D. Mayhew, et al., *IEEE Proceedings of the 11th Symposium on High Performance Interconnects*, 2003.
"PCI Express Architecture, PHY Electrical Test Considerations, Revision 1.0RD", PCI Express, Sep. 3, 2003, pp. 1-32.
"SMS5000 PCI-Express Pipe Phy Transceiver", Soft Mixed Signal Corporation, www.softmixedsignal.com, 2003 Preliminary.

* cited by examiner

*Primary Examiner*—Robert J. Pascal
*Assistant Examiner*—James Goodley

(57) ABSTRACT

A method, algorithm, software, architecture, circuit, and/or system for detecting an idle condition and maintaining a frequency of a clock/data recovery circuit are disclosed. In one embodiment, a method of maintaining a frequency of a clock/data recovery circuit can include the steps of: (i) comparing a difference value from a differential signal with a predetermined threshold (or value); (ii) controlling a variable frequency oscillator (VFO) with a frequency detector when the difference value is less than the threshold for at least a predetermined integration time; and (iii) controlling the VFO with a phase detector receiving the differential signal when the difference value is greater than the threshold. Embodiments of the present invention can advantageously provide a reliable and simplified design approach for clock data recovery (CDR) circuits operable with low power mode transmitters.

20 Claims, 4 Drawing Sheets

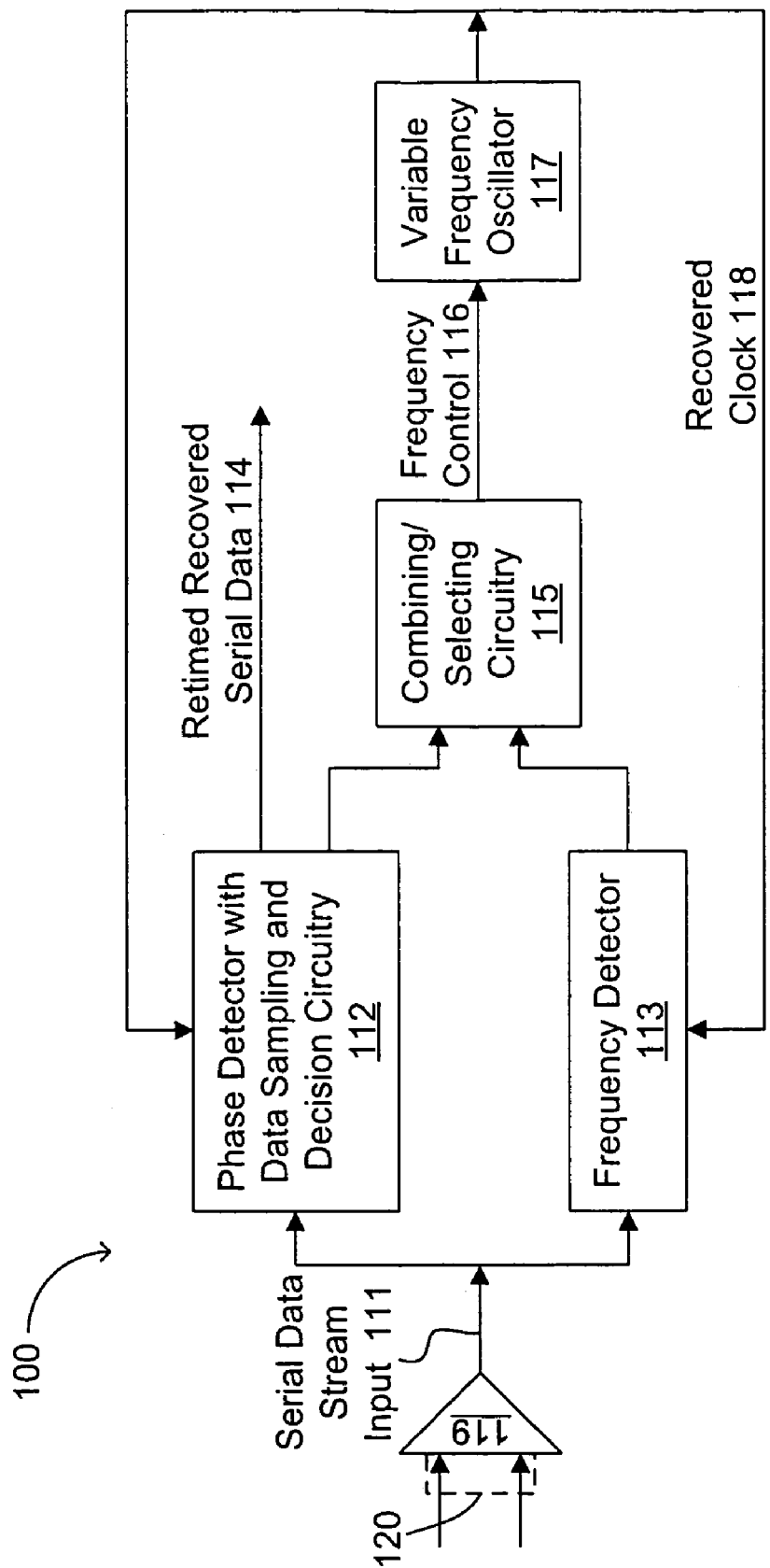
FIG. 1 (conventional)

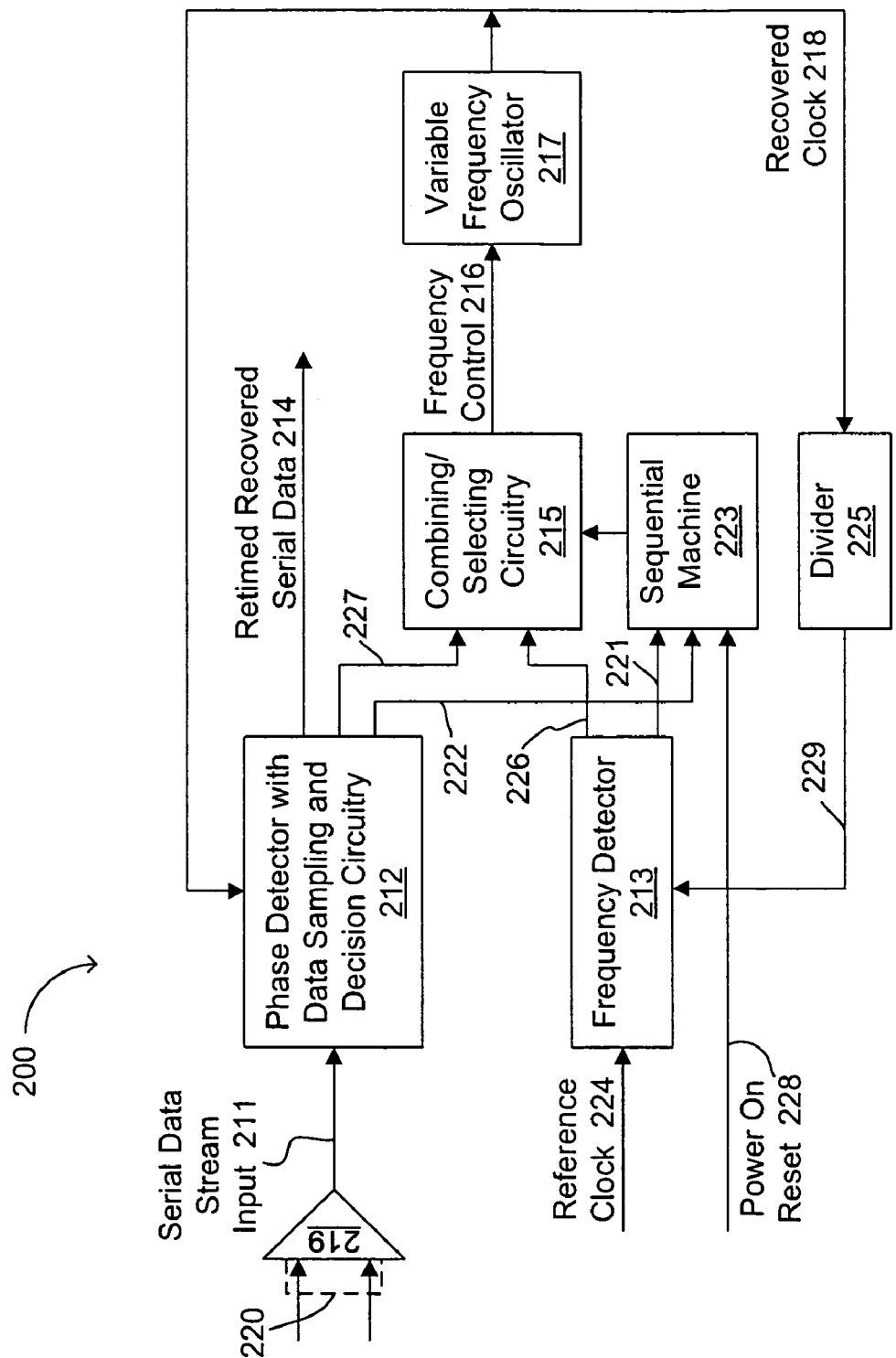
FIG. 2 (conventional)

METHOD AND APPARATUS FOR MAINTAINING A CLOCK/DATA RECOVERY CIRCUIT FREQUENCY DURING TRANSMITTER LOW POWER MODE

FIELD OF THE INVENTION

The present invention generally relates to the field of serial data and clock recovery. More specifically, embodiments of the present invention pertain to methods, algorithms, software, systems, circuits, and architectures for clock data recovery (CDR) circuits recovering clock and/or data signals quickly following periods of transmitter inactivity (e.g., due to a transmitter power saving mode).

DISCUSSION OF THE BACKGROUND

In many digital communication systems, embedded clock and/or data signals may be recovered from a nonreturn-to-zero (NRZ) encoded high speed serial data stream. Referring now to FIG. 1, a conventional approach to accomplish embedded clock data recovery in an NRZ encoded high speed serial data stream is shown and indicated by the general reference character 100. Differential serial input data stream 120, which may be degraded from the transmitted data by the addition of noise and the attenuation of the signal content, is connected to receiver 119. Receiver 119 amplifies signal 120 to produce serial data stream input 111, which is input to phase detector (with data sampling and decision circuitry) 112 and frequency detector 113. These circuits respectively compare the phase and frequency of signal transitions in the serial data stream (e.g., serial data stream input 111) to the phase and frequency of recovered clock signal 118, the output of variable frequency oscillator (VFO) 117.

Combining or selecting circuitry 115 couples the result of the phase and frequency comparisons to frequency control signal 116 for VFO 117 using one of several methods known in the art. Serial data stream input 111 and recovered clock 118 are also used by the data sampling and decision circuitry portion of block 112 to decide the value of the input data stream at an appropriate transition of recovered clock 118. The output of the data sampling and decision circuitry portion of block 112 is retimed recovered serial data 114, which is now substantially phase coherent with recovered clock 118 and which typically has more robust signal levels than input data stream 120.

Drawbacks of this approach include: (i) relative difficulty in design due to the signal spectrum of the NRZ data, and (ii) susceptibility to false lock, either to a harmonic or 180° out-of-phase (typically when the VFO frequency range is too wide for the frequency of the incoming data 120). Also, as devices get smaller and integration on monolithic devices increases, minimizing power consumption becomes an increasingly important objective. For example, in order to save power when there is no useful data to transmit, transmitters in communications systems may enter a low power mode, in which there are no transitions on the data signaling lines. A further drawback of the approach of FIG. 1 relates to inoperability with transmitter low power modes that do not provide data transitions for clock data recovery (CDR) circuit synchronization.

One common technique to overcome some problems associated with the conventional approach described above with reference to FIG. 1 is to provide a clock data recovery (CDR) circuit with a low speed reference clock having a frequency that has a fraction of the serial data stream frequency. This simplifies the determination of the initial frequency value of the VFO, even when the VFO has a wide frequency range.

Referring now to FIG. 2, a conventional approach using a low speed reference clock is shown and indicated by the general reference character 200. Differential input data stream 220 is coupled to phase detector (with data sampling and decision circuitry) 212 through amplifying receiver 219. Frequency detector 213 compares the frequency of low-speed reference clock 224 (generally a fraction of the serial data stream frequency) with signal 229, the frequency of which is generally recovered clock signal 218 (the VFO 217 output), divided by the frequency division ratio of divider 225. An output of frequency detector 213 is a frequency control signal 226 connected to combining/selecting circuitry 215. Another output of frequency detector 213 is frequency lock signal 221 connected to sequential machine 223, which is initialized by power-on reset signal 228. Outputs from phase detector 212 include frequency control signal 227 to combining/selecting circuitry 215 and control signal(s) 222 to sequential machine 223. These control signals 222 and 227 typically include a lock signal and a "no-signal-transition" signal.

In operation, sequential machine 223 is initialized and sets combining/selecting circuitry 215 to select the output of frequency detector 213. The operation of the loop composed of frequency detector 213, VFO 217, and divider 225 changes the frequency of VFO 217 to be the frequency of reference clock 224 multiplied by the frequency division ratio of divider 225. When frequency lock is achieved, lock indicator control 221 will change the state of sequential machine 223 to cause combining/selecting circuitry 215 to deselect control signal 226 and couple the output of phase detector 212 to frequency control 216 input to VFO 217. At this time, phase detector 212 controls the frequency of VFO 217 largely using data transition phase in the serial data stream. The input data stream should provide (or be monitored to ensure) sufficient data transitions to keep the VFO frequency locked and to compensate for normal frequency variations of VFO 217 and its associated control circuitry. If insufficient data transitions occur over some time interval, or if lock of VFO 217 to data is lost for some other reason (e.g., a temperature or voltage excursion causing a frequency variation greater than the lock range of the phase detector 212), sequential machine 223 changes state and again causes the loop to lock to reference clock 224.

To save power, it is desirable for a transmitter to shut down and transmit no transitions on the data lines when no useful data is available for transmission. This saves power in associated transmitter circuitry by not having to drive data signal transitions merely for purposes of CDR circuit synchronization. However, when no useful data is transmitted, many communications protocols transmit "IDLE" characters containing a sufficient number of transitions to preserve the lock state in a CDR circuit containing a phase detector such as phase detector 212. This sequence is typically referred to as the transmitter entering a "logical idle" state.

When in such a "logical idle" state, it is also desirable to indicate to the receiver if no data is expected to be available for a relatively long period of time, so that the transmitter and/or receiver may enter an even lower power state. Some communications protocols indicate this condition by the transmitter sending a message saying it is about to enter an idle period, subsequently entering the "logical idle" state for a predetermined period of time, and then holding the transmit driver output at a fixed logic level (e.g., a differential voltage indicating a logic state "0"). When useful data is again available for transmission, the transmitter may first prepend to the data a preamble (sometimes called a "training sequence") that contains sufficient transitions on the data lines to pull the VFO in the receiver into lock. Normal data transmissions can then be resumed.

An alternative signaling scheme to indicate entrance and exit from the idle state is possible when the input data stream is a binary signal being transmitted over a differential pair. A differential signaling scheme sends the data as a voltage and/or current difference between a pair of signal lines where the differential signal lines are in complementary states (e.g., one line may be in the "high" state and the other may be in the "low" state, or vice versa). Essentially, no other states are allowed except those temporary or transitional states that might exist during the transition from one state (e.g., high) to the other (e.g., low). Putting both lines of the pair to a substantially identical voltage or current (e.g., to a voltage midway between the "high" and "low" levels) can indicate a special state. For example, the Peripheral Component Interconnect (PCI) Express protocol defines such a special state of the differential pair coupled to a transmitter as an "electrical idle" state, and it is used to indicate the absence of useful or valid data to transmit. This is a fairly reliable method of signaling such a state because a transmission error on, or a physical defect of, a single line of a differential pair cannot typically cause the false occurrence of this state. However, the approach of FIG. 2 still has a number of shortcomings, in that the phase and/or frequency of recovered clock 218 can drift as long as phase detector 212 controls VFO 217, and CDR circuit 200 must lose its lock before control of the VFO 217 switches over to frequency detector 213. If the phase and/or frequency drift is sufficiently great, the recovered clock and/or data signals may lock onto an out-of-phase signal or a harmonic. On the other hand, reliable recovery of in-phase and frequency-appropriate clock and/or data signals are not necessarily guaranteed if lock is lost.

What is desired is a reliable and simple design approach for CDR circuits more fully operable with low power mode transmitters. Further, it is also desirable to have a relatively quick "wake-up" period to recover clock and/or data signals upon exit from such a low power mode, for example by maintaining at least a frequency lock for the recovered clock signal, or minimizing the phase and/or frequency drift of the recovered clock signal so that it is less likely to lock onto an out-of-phase signal or a harmonic of the incoming differential input signal.

SUMMARY OF THE INVENTION

Embodiments of the present invention relate to methods, algorithms, software, architectures, circuits, and/or systems for detecting an idle state on a differential signal and maintaining and/or recovering a clock and/or data signal at a suitable or appropriate frequency.

In one embodiment, a method of maintaining a frequency of a clock/data recovery circuit generally includes the steps of: (i) comparing a difference value from a differential signal with a predetermined threshold (or value); (ii) controlling a variable frequency oscillator (VFO) with a frequency detector when the difference value is less than the threshold for at least a predetermined integration time; and (iii) controlling the VFO with a phase detector receiving the differential signal when the difference value is greater than the threshold.

In another embodiment, a clock control circuit generally includes: (i) a difference detector configured to detect a difference in an electrical parameter of a differential input signal; (ii) a frequency detector coupled to an output of the difference detector, configured to receive a reference clock and provide a frequency detection signal; and (iii) a selector circuit configured to receive a phase adjustment signal and the frequency detection signal, and provide a clock control signal therefrom.

Embodiments of the present invention can advantageously provide a reliable and simplified design approach for clock data recovery (CDR) circuits more fully operable with low power mode transmitters. Further, embodiments of the present invention can advantageously provide a relatively quick and efficient "wake-up" period for recovering clock and/or data signals upon exit from transmitter low power modes. In one embodiment, the invention uses electrical idle signaling to simplify clock and/or data recovery, as compared to conventional CDR loop operation. Also, present and future communications protocols may be able use a shorter training sequence to enable CDR circuits to recover clock and/or data signals from idle inputs. These and other advantages of the present invention will become readily apparent from the detailed description of preferred embodiments below.

BRIEF DESCRIPTION OF THE DRAWINGS

FIG. 1 is a schematic diagram showing a conventional approach to accomplish embedded clock data recovery in a nonreturn-to-zero (NRZ) encoded high speed serial data stream.

FIG. 2 is a schematic diagram showing a conventional approach using a low speed reference clock.

DETAILED DESCRIPTION OF THE PREFERRED EMBODIMENTS

Figure 3:
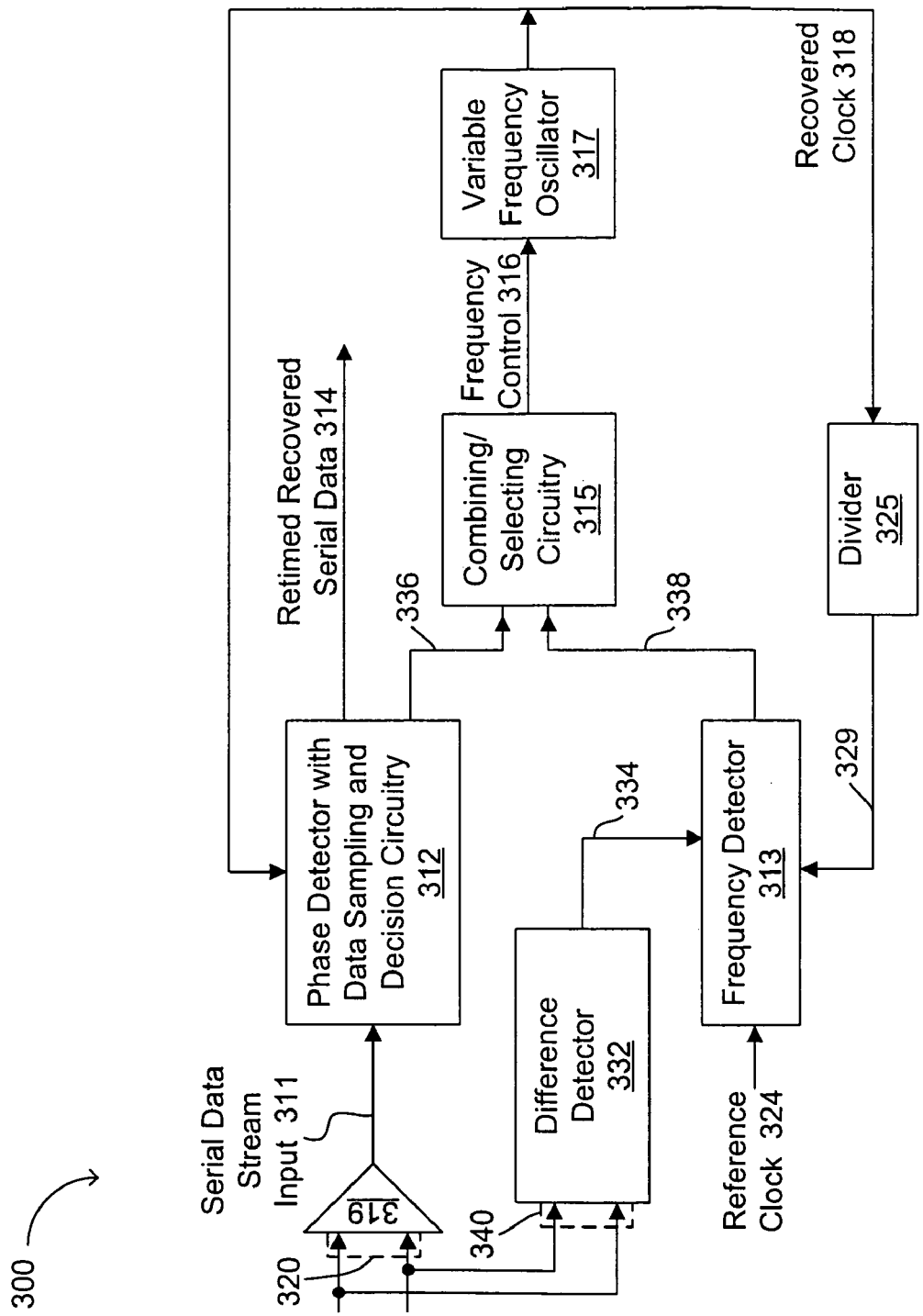
FIG. 3 is a schematic diagram showing a simplified clock data recovery (CDR) circuit using electrical idle signaling according to embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, software, architectures, circuits, and/or systems for detecting an idle state on a differential signal and maintaining clock/data recovery frequency. For example, the method and/or algorithm for detecting an idle condition generally includes the steps of: (i) comparing a difference value from a received differential signal with a predetermined threshold value; (ii) indicating an idle condition when the difference value is less than the threshold value for at least a predetermined integration time; and (iii) de-indicating the idle condition when the difference value is greater than the threshold value. The idle condition can correspond to a low power state of a transmitter, for example.

In another aspect of the invention, a method and/or algorithm of maintaining a frequency of a clock data recovery circuit can include the steps of: (i) comparing a difference value from a differential signal with a predetermined threshold value; (ii) controlling a variable frequency oscillator (VFO) with a frequency detector when the difference value is less than the threshold value for at least a predetermined integration time; and (iii) controlling the VFO with a phase detector receiving the differential signal when the difference value is greater than the threshold value.

In yet another aspect of the invention, a clock control circuit generally includes: (i) a difference detector configured to determine a difference in an electrical parameter of a differential input signal; (ii) a frequency detector coupled to an output of the difference detector, receiving a reference clock and providing a frequency detection signal; and (iii) a selector circuit receiving a phase adjustment signal and the frequency detection signal, and providing a clock control signal therefrom.

The invention further relates to hardware and/or software implementations of the present architecture, method and system. For example, the software implementation of the invention relates to a medium or waveform containing a computer-readable set of instructions, where the instructions can be adapted to perform one or more of the present methods, such as the method of detecting an idle condition above, and activating (or enabling) a frequency detector receiving a reference clock when the idle condition is indicated.

Embodiments of the present invention can advantageously provide a reliable and simplified design approach for clock data recovery (CDR) circuits operable with low power mode transmitters. Further, embodiments of the present invention can advantageously provide a relatively quick and efficient "wake-up" period for recovering clock and/or data signals upon exit from transmitter low power modes. For example, the use of electrical idle signaling can simplify clock and/or data recovery as compared to conventional clock data recovery (CDR) loop operation (e.g., the CDR loop of FIG. 2), and possibly enable shorter training sequences to be used to lock a CDR circuit onto a data input signal. The invention, in its various aspects, will be explained in greater detail below with regard to exemplary embodiments.

An Exemplary Clock Data Recovery (CDR) Circuit

An exemplary CDR circuit can include a control circuit portion and an oscillator portion. The control circuit can include a difference detector, a selector circuit, and a frequency detector. The difference detector can receive a differential input signal pair, for example. The selector circuit can receive a phase adjustment signal and a frequency detector output signal. The frequency detector can interface with the difference detector, generally by receiving the output of the difference detector. The frequency detector also generally receives a reference clock signal and outputs a signal proportional to the difference in frequency between the input reference clock and the VFO to the selector circuit. The oscillator portion may comprise a variable frequency oscillator (VFO) and, as part of a clock and/or data signal recovery loop, a phase detector configured to receive the differential input signal and an output of the VFO.

The difference detector may detect an idle state on the differential input signal pair. For example, such an idle state may correspond to a low power mode of a transmitter where there are no transitions on the differential input signal pair. Further, the frequency detector may be enabled when such an idle state is detected. The difference detector may also include a circuit for comparing a voltage and/or a current difference between the two signals of the differential input signal pair. Further, the idle state may be detected when, for example, the voltage and/or current difference between the two signals of the differential input signal pair is less than some threshold value. The threshold value is generally substantially less than an absolute value of one of the two signals of the differential input signal pair. For example, the threshold value may be 65 mV or less, and the voltage range of the two complementary signals on the differential input signal pair may be from about 0V to about 3V.

A variable frequency oscillator (VFO) may also be included in the exemplary CDR circuit. Oscillator circuits suitable for use in the present CDR circuit include ring oscillators and LC oscillators, either of which may be configured as a current-controlled or voltage-controlled oscillator. The VFO may be controlled by a clock control circuit, which may in turn comprise the phase adjustment signal, the frequency detection signal, or a logical combination of the two (e.g., the output of a logic gate or function into which the phase adjustment and frequency detection signals are inputs), for example. In one implementation, the selector circuit can select the phase adjustment signal and/or the frequency detection signal for control of the VFO. For example, the selector circuit may comprise an OR gate configured to receive the phase adjustment signal and the frequency detection signal. The phase adjustment signal can be generated by a phase detector or a phase frequency detector (PFD). The phase detector may comprise a latch, such as a D-type flip-flop (DFF), configured to trap (or store) one signal upon a transition of another. In this fashion, a relative comparison of the phase difference, at least in terms of which of the two signals transitions first, can be determined. In fact, it may be possible to configure a PFD such that at least some part of the phase adjusting circuitry therein receives a data signal from the differential input pair, at least some part of the frequency detecting (or adjusting) circuitry therein receives a reference clock signal, and both parts of the phase adjusting circuitry and frequency detecting circuitry receive both the recovered clock signal from the VFO and the output of the difference detector, so that different parts of or circuits in the same functional block of VFO-controlling circuitry can perform the VFO control function at different times. Based on this determination, a phase adjustment signal can be provided in order to adjust the phase and/or frequency of a recovered clock.

For example, the phase adjustment may be used in order to approximate the adjustment (forward or backward) or gain factor to be applied to an output or recovered clock so as to coincide in time with an input reference signal clock. Typically, the circuit operates so that a phase difference between two clocks or signals of or about zero degrees is obtained, for example, in a standard phase-locked loop (PLL) system. Depending on the type of clock construction circuit used, the phase adjustment signal from a phase detector or a PFD may be used to adjust a voltage-controlled oscillator (VCO) or perhaps to increment a digital accumulator circuit. For the digital accumulator type, the most significant bit (MSB) is typically used to form the output clock of the system.

Referring now to FIG. 3, a schematic diagram showing a simplified clock data recovery (CDR) circuit using electrical idle signaling according to embodiments of the present invention is indicated by the general reference character 300. Differential pair 320 (and traces 340 as shown in FIG. 3) of the input data stream can connect to both amplifying receiver 319 as well as to difference detector 332. Difference detector 332 generally comprises a conventional voltage and/or current comparator circuit to detect the difference between the voltage and/or current of each line in the differential signal pair. Such a comparator can essentially determine if a differential parameter (such as voltage) has a value greater than some predetermined threshold (e.g., a relatively small value, such as 100 mV or less, or in some more advanced technologies, 65 mV or less). Thus, the electrical parameters that difference detector 332 detects a difference in generally include voltage and current, although other parameters can also be monitored (directly or indirectly) for the difference in values on the complementary differential signal lines. Difference detector 332 may further include sampling circuitry, for example.

When both lines of the differential pair 320/340 are at substantially the same voltage and/or current level (i.e., within a predetermined threshold), enable signal 334 enables frequency detector 313 to operate. For example, enable signal 334 may connect to a logic circuit in frequency detector 313 configured to activate frequency detector 313 if enable signal 334 transitions to a "high" state in response to both signals of differential pair 320/340 being at about the same voltage level.

Similar to the description above with reference to FIG. 2, the loop formed by frequency detector 313, variable frequency oscillator (VFO) 317, and divider 325 can act to lock the VFO frequency to the frequency of reference clock 324 multiplied by the frequency division ratio of divider 325. Combining/selecting circuitry 315 can, in one implementation, consist essentially of a logical-OR gate because electrical idle signaling cannot occur when there are data transitions, so phase detector 312 can be inactive during this time. Accordingly, the design of phase detector 312 can further include the use of the logical inverse of enable signal 334 to disable of phase detector 312, for example by decoupling power to phase detector 312. Phase detector (with data sampling and decision circuitry) 312 can provide phase adjustment signal 336 as one input to combining/selecting circuitry 315, and frequency detector 313 can provide frequency detection (or frequency adjustment) signal 338 as another input to combining/selecting circuitry 315.

In FIG. 3, the clock data recovery (CDR) may stay locked to reference clock 324 during the idle or transmitter power saving mode period. Further, reference clock 324 multiplied by the frequency division ratio of divider 325 is generally very close (e.g., to within about 1-3%, or less in certain applications) to the frequency of the transmitted data, so relatively few transitions may be required to lock to transmit data when exiting the idle state. Also, in addition to divider 325, a multiplier may be included in the CDR circuit 300 of FIG. 3 so that frequency ratios of, for example, 57 divided by 17, or other "P" and "Q" multiply and divide ratios, can be accommodated. When exiting the idle state, the transmitter can change the voltage and/or current on differential pair 320/340 to a valid logic state (e.g., either "0" or "1") and transmit a short training sequence as a preamble to normal data transmission(s).

In this fashion, a clock/data recovery circuit can be configured to detect and to quickly recover from a transmitter low power mode and/or idle state in which there are substantially no transitions on a differential signal pair for a period of time.

Exemplary Methods of Detecting an Idle Condition and Controlling an Oscillator

An exemplary method of detecting an idle condition can include the steps of: (i) comparing a difference value from a received differential signal with a predetermined threshold; (ii) indicating an idle condition (e.g., by asserting an active "idle condition" indicator signal) when the difference value is less than the threshold for at least a predetermined integration time; and (iii) de-indicating the idle condition (e.g., de-asserting the "idle condition" indicator signal or other such indication) when the difference value returns to a value greater than the threshold. The idle condition can correspond to a low power state of a transmitter, for example.

The difference value can be a voltage and/or a current difference (e.g., depending on the type of signaling used on the received differential signal pair), and the predetermined threshold value can be substantially less than an absolute value of either one of a differential signal pair, as described above.

A method of controlling an oscillator, such as a voltage controlled oscillator (VCO) or a variable frequency oscillator (VFO), can include the present method of detecting an idle condition, plus the step of activating a frequency detector that receives a reference clock when an idle condition is indicated. Further, de-asserting the idle condition indication can include returning to a state of active clock and/or data recovery (and the method may further comprise recovering clock and/or data signals from the received differential signal when the idle condition indication is not asserted). Detection of an idle condition can correspond to a transmitter power savings mode, for example.

Figure 4:
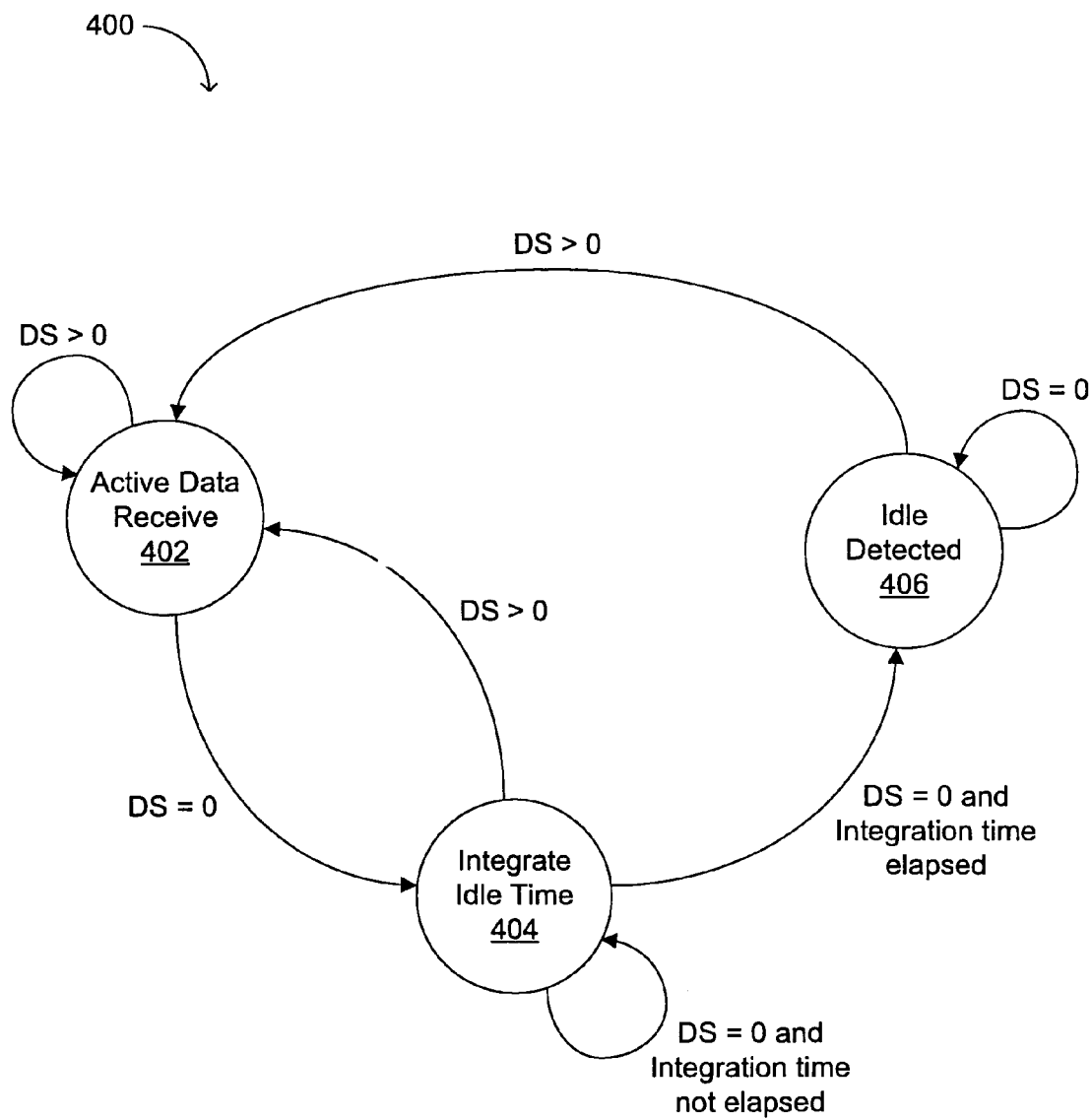
FIG. 4 is an exemplary state diagram showing a method of idle detection and/or CDR circuit control according to embodiments of the present invention.

Referring now to FIG. 4, an exemplary state diagram showing a method of idle detection according to embodiments of the present invention is indicated by the general reference character 400. As is known by those skilled in the art, a differential signal (DS)=0 indication implies that the absolute value of the electrical parameter difference between the two signals of the differential pair is less than some predetermined (and generally relatively small) value. In the following example, the electrical parameter is voltage, but as discussed herein, current or other electrical parameters can be similarly monitored. However, a differential voltage of about zero volts can sometimes indicate signal transitions consistent with normal data transfer. Accordingly, in order to determine that an idle state exists, an "integration" interval (e.g., two or more clock cycles) can be specified that is essentially the minimum time a differential voltage must stay at or about zero (e.g., some value less than a predetermined threshold, such as 65 mV) before it can be concluded that the idle state exists at the transmitter. Such an interval is typically specified in the communications protocol used, and it should be significantly longer than the maximum specified signal transition time, for example. While signals may transition within a clock phase or period, an integration interval may be 1, 2, 3, 4, 5 or more clock cycles, for example.

In FIG. 4, while in active data receive state 402 (e.g., normal data transfer), the value of the differential voltage can be monitored. If this differential voltage is less than a predetermined small value (indicated in FIG. 4 as "DS=0"), the state can change to state integrate idle time 404. In state integrate idle time 404, the time that the voltage and/or current remains at less than the predetermined small is monitored. If the differential voltage and/or current remains at less than the predetermined small value ("DS=0") for at least the integration time, the idle state may be detected and the state machine can transition to state idle detected 406. Further, enable signal 334 of FIG. 3 may be asserted to activate frequency detector 313 upon entry into state idle detected 406. The state machine of FIG. 4 can remain in state idle detected 406 as long as DS=0 (i.e., the differential voltage is less than a predetermined value). Whenever the differential voltage and/or current is greater than the predetermined small value (indicated in FIG. 4 as "DS>0"), the idle state may be departed and clock and data recovery can begin again in state active data receive 402.

Exemplary Method of Maintaining a Frequency of a Clock Data Recovery (CDR) Circuit An exemplary method of maintaining a frequency of a clock data recovery circuit can include the steps of: (i) comparing a difference value from a differential signal with a predetermined threshold value; (ii) controlling a variable frequency oscillator (VFO) with a frequency detector when the difference value is less than the threshold value for at least a predetermined integration time; and (iii) controlling the VFO with a phase detector receiving the differential signal when the difference value is greater than the threshold value. The difference value, the predetermined threshold value, and the predetermined integration time can be as described above.

In this fashion, a transmitter low power mode can be detected by monitoring differential signals at a receiver and/or CDR circuit. Further, clock/data recovery circuits can be activated and/or deactivated in response to the detection of such an idle transmission state and/or active data receive state. Thus, embodiments of the present invention can advantageously provide a reliable and simplified design approach for clock data recovery (CDR) circuits operable with low power mode transmitters. Further, embodiments of the present invention can advantageously provide a relatively quick and efficient "wake-up" period for recovering clock and/or data signals upon exit from transmitter low power modes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of maintaining a frequency of a clock data recovery circuit having a differential signal input including a true signal input and a complement signal input, comprising the steps of:
   a) determining a magnitude difference value between said true signal input and said complement signal input, and comparing the determined magnitude difference value with a predetermined maximum value;

b) controlling a variable frequency oscillator (VFO) with a frequency detector when the determined magnitude difference value remains less than said predetermined maximum value for a duration exceeding a predetermined comparison time period; and c) controlling said VFO with a phase detector when the determined magnitude difference value is greater than said predetermined maximum value.

2. The method of claim 1, wherein said magnitude difference value is one of a voltage difference or a current difference between said true signal input and said complement signal input.

3. The method of claim 1, wherein said predetermined maximum value is less than a third of a nominal difference value defined as an absolute value of a difference between a nominal logic high signal level and nominal logic low signal level on said true signal input and complement signal input of said differential signal input.

4. The method of claim 1, wherein the frequency detector is configured to receive a reference clock signal and to provide a frequency detection signal for locking the variable frequency oscillator to said reference clock when the difference magnitude difference value remains less than said predetermined maximum value for said duration exceeding said predetermined comparison time period.

5. A medium or waveform containing a computer-readable set of instructions adapted to perform the method of claim 1.

6. A clock control circuit having a differential signal input including a true signal input and a complement signal input, comprising:

a) a difference detector configured to determine a magnitude difference in an electrical parameter of said true signal input and said complement signal input, and to compare the determined magnitude difference with a predetermined maximum difference;

b) a frequency detector coupled to receive an output of said difference detector, configured to receive a reference clock and to provide a frequency detection signal indicative of a frequency difference between said reference clock and an frequency output from a variable frequency oscillator; and c) a selector circuit configured to receive said frequency detection signal and a phase adjustment signal indicative of a phase difference between said differential signal input and said frequency output from said variable frequency oscillator, and to provide a clock control signal for said variable frequency oscillator therefrom.

7. The clock control circuit of claim 6, wherein said difference detector is configured to indicate an idle state when the determined magnitude difference is less than said predetermined maximum difference for a duration exceeding a predetermined comparison time period.

8. The clock control circuit of claim 6, wherein said frequency detector is enabled in response to said difference detector indicating said idle state.

9. The clock control circuit of claim 6, wherein said difference detector comprises a voltage or current comparator.

10. The clock control circuit of claim 9, wherein said difference detector further comprises sampling circuitry.

11. A clock data recovery (CDR) circuit, comprising the control circuit of claim 6, and said variable frequency oscillator (VFO) configured to (i) receive said clock control signal and (ii) provide a recovered clock signal.

12. The CDR circuit of claim 11, further comprising a phase detector configured to (i) receive said recovered clock signal and a data stream on said differential signal input, and (ii) generate said phase adjustment signal therefrom.

13. The CDR circuit of claim 11, further comprising a divider configured to divide a frequency of said recovered clock signal and provide a frequency-divided recovered clock signal to said frequency detector.

14. A clock control circuit, comprising:

a) a phase detector configured to receive a differential input including a true signal input and a complement signal input, and to output a phase adjustment signal, and having a first enable input;

b) a frequency detector configured to receive a reference clock and provide a frequency detection signal, said frequency detector having a second enable input;

c) a difference detector coupled to receive said differential input, and to issue a first control signal if it determines that a magnitude difference in an electrical parameter of said true signal input and said complement signal input is maintained lower than a predetermined value for longer than a predetermined time duration, and to issue a second control signal otherwise, wherein said said frequency detector is enabled in response to said first control signal and is disabled in response to said second control signal;

d) a combining circuit configured to receive said phase adjustment signal and said frequency detection signal and to provide a clock control signal therefrom.

15. The clock control circuit of claim 14, wherein said phase detector is disabled in response to first control signal and disabled in response to said second control signal.

16. The clock of control circuit of claim 14, wherein said first enable input is coupled to receive said second control signal and said second enable input is configured to receive said first control signal.

17. The method of claim 1, wherein said predetermined maximum value is set to less than two percent of a nominal difference value defined as an absolute value of a difference between a nominal logic high signal level and nominal logic low signal level on said true signal input and complement signal input of said differential signal input.

18. The method of claim 1, wherein said clock data recovery circuit is responsive to a system clock, and said predetermined comparison time period is equal to an integral number of clock cycles of said system clock.

19. The method of claim 18, wherein said integral number of clock cycles is at least two.

20. The method of claim 1, wherein:

said variable frequency oscillator outputs a first controlled frequency when controlled by said phase detector;

said variable frequency oscillator outputs a second controlled frequency when controlled by said frequency detector; and said second controlled frequency is within three percent of said first controlled frequency.

* * * * *